United States Patent
Myronov et al.

(10) Patent No.: US 10,907,273 B2
(45) Date of Patent: Feb. 2, 2021

(54) GROWING EPITAXIAL 3C-SIC ON SINGLE-CRYSTAL SILICON

(71) Applicant: The University of Warwick, Warwickshire (GB)

(72) Inventors: Maksym Myronov, Warwickshire (GB); Gerard Colston, Warwickshire (GB); Stephen Rhead, Warwickshire (GB)

(*) Notice: Subject to any disclaimer, the term of this patent is extended or adjusted under 35 U.S.C. 154(b) by 194 days.

(21) Appl. No.: 15/743,879

(22) PCT Filed: Jul. 22, 2016

(86) PCT No.: PCT/GB2016/052244
§ 371 (c)(1),
(2) Date: Jan. 11, 2018

(87) PCT Pub. No.: WO2017/013445
PCT Pub. Date: Jan. 26, 2017

(65) Prior Publication Data
US 2018/0209063 A1   Jul. 26, 2018

(30) Foreign Application Priority Data

Jul. 23, 2015 (GB) .................................. 1513014.9
Sep. 29, 2015 (GB) .................................. 1517167.1

(51) Int. Cl.
*C30B 25/02* (2006.01)
*C30B 25/10* (2006.01)
(Continued)

(52) U.S. Cl.
CPC ............ *C30B 25/10* (2013.01); *C23C 16/325* (2013.01); *C23C 16/52* (2013.01); *C30B 25/02* (2013.01); *C30B 29/06* (2013.01); *C30B 29/36* (2013.01)

(58) Field of Classification Search
CPC .......... C30B 25/02; C30B 25/04; C30B 25/08
See application file for complete search history.

(56) References Cited

U.S. PATENT DOCUMENTS

| 7,892,970 B2 * | 2/2011 | Hasan .................... C30B 25/18 |
| | | 257/E21.438 |
| 9,546,420 B1 * | 1/2017 | Habermehl ........... C23C 16/325 |
| 2015/0252471 A1 * | 9/2015 | Lee ..................... C23C 16/4412 |
| | | 427/575 |

FOREIGN PATENT DOCUMENTS

| CN | 104152986 A | 11/2014 |
| EP | 1160361 A1 | 12/2001 |

(Continued)

OTHER PUBLICATIONS

EPO; European Search Report for European Patent Application No. 16753686.1 dated Nov. 15, 2019, 6 pages.

(Continued)

*Primary Examiner* — Robert M Kunemund
(74) *Attorney, Agent, or Firm* — NK Patent Law (57) ABSTRACT

A method of growing epitaxial 3C-SiC on single-crystal silicon is disclosed. The method comprises providing a single-crystal silicon substrate in a cold-wall chemical vapour deposition reactor, heating the substrate to a temperature equal to or greater than 700° C. and equal to or less than 1200° C., introducing a gas mixture into the reactor while the substrate is at the temperature, the gas mixture comprising a silicon source precursor, a carbon source precursor and a carrier gas so as to deposit an epitaxial layer of 3C-SiC on the single-crystal silicon.

17 Claims, 7 Drawing Sheets

(51) Int. Cl.
  *C23C 16/32* (2006.01)
  *C30B 29/36* (2006.01)
  *C23C 16/52* (2006.01)
  *C30B 29/06* (2006.01)

(56) References Cited

FOREIGN PATENT DOCUMENTS

| JP | 2004253751 A | 9/2004 |
| --- | --- | --- |
| RU | 2499324 C2 | 4/2013 |
| WO | WO2008011022 A1 | 1/2008 |
| WO | WO2009021199 A1 | 2/2009 |

OTHER PUBLICATIONS

Zorman, Christian A., et al., "Epitaxial Growth of 3C-SiC Films on 4 in. diam (100) Silicon Wafers by Atmospheric Pressure Chemical Vapor Deposition", Journal of Applied Physics, American Institute of Physics, US, vol. 78, No. 8, Oct. 15, 1995, pp. 5136-5138.

Rosapatent; Search Report for Russian Patent Application No. 2018105878 dated Sep. 27, 2019, 4 pages.

Y. Gao et al.: "Low-temperature chemical-vapor deposition of 3C-SiC films on Si(1 0 0) using SiH4—C2H4—HCl—H2", Journal of Crystal Growth, vol. 191, Issue 3, Jul. 15, 1998, pp. 439-445.

Hiroyuki Nagasawa et al.: "3C-SiC hetero-epitaxial growth on undulant Si(0 0 1) substrate", Journal of Crystal Growth, 237-239 (2002), pp. 1244-1249.

UKIPO, Search Report for GB Patent Application No. GB1513014.9, dated Sep. 8, 2015.

ISA/EP, International Search Report and Written Opinion for PCT Patent Application No. PCT/GB2016/052244, dated Oct 31, 2016.

R. Anzalone et al.: "Heteroepitaxy of 3C-SiC on different on-axis oriented silicon substrates", Journal of Applied Physics, vol. 105, p. 084910 (2009).

Wei-Yu Chen et al.:"Crystal Quality of 3C-SiC Influenced by the Diffusion Step in the Modified Four-Step Method", Journal of the Electrochemical Society, vol. 157, pp. H377-H380 (2010).

WIPO, International Preliminary Report on Patentability for PCT Patent Application No. PCT/GB2016/052244, dated Jan. 23, 2018.

\* cited by examiner

GROWING EPITAXIAL 3C-SIC ON SINGLE-CRYSTAL SILICON

CROSS REFERENCE TO RELATED APPLICATION(S)

This application is a 371 National Phase Application of PCT Patent Application No. PCT/GB2016/052244 filed on Jul. 22, 2016, which claims priority to United Kingdom Patent Applications No. 1517167.1 filed on Sep. 29, 2015 and No. 1513014.9 filed on Jul. 23, 2015, the entire content of all of which is incorporated by reference herein.

FIELD OF THE INVENTION

The present invention relates to a method of and a system for growing epitaxial 3C-silicon carbide on single-crystal silicon, particularly, but not exclusively, on-axis, 001-orientated single-crystal silicon.

BACKGROUND

Silicon carbide is wide-bandgap compound semiconductor material which is well suited to being used in high-power and high-frequency electronic devices on account of having high values of thermal conductivity, breakdown field and saturation velocity.

Silicon carbide exists in several different crystal forms (or "polytypes") depending on the sequence in which bi-layers of silicon and carbon stack. Of these polytypes, 3C-silicon carbide (3C-SiC), 4H-silicon carbide (4H-SiC) and 6H-silicon carbide (6H-SiC) are most commonly used in electronic devices and in micro-electro-mechanical systems (MEMS) and sensors and as a low-cost platform for growing other materials, such as gallium nitride (GaN).

4H- and 6H-SiC substrates are commercially available and high-quality homoepitaxial layers of 4H- and 6H-SiC can be grown on these types of substrates. However, 4H- and 6H-SiC substrates are much more expensive to produce than silicon substrates and are much smaller.

Although 3-SiC substrates are not available, heteroepitaxial 3C-SiC can be grown on silicon. This allows larger, cheaper silicon wafers to be used. Currently, however, hot-wall chemical vapour deposition (CVD) reactors are used to grow 3C-SiC epitaxial layers on silicon. High-temperature cold-wall CVD reactors have purportedly been used to grow 3C-SiC epitaxial layers on silicon, although it is unclear how temperatures exceeding 1,300° C. can be achieved in such reactors without damaging the reactor or component lying inside the reactor.

Moreover, most, if not all, of the research into 3C-SiC/Si heteroepitaxy tends to be conducted on small substrates, such as 50 mm-diameter wafers or 10 mm dies. This can give a misleading impression of whether or not a given heteroepitaxial process has been successful and suitable for production since it is easier to achieve a uniform temperature across a small substrate. Thus, small heterostructures may not reveal problems regarding lack of uniformity across the wafer, voiding, and wafer bow.

For example, R. Anzalone et al.: "Heteroepitaxy of 3C-SiC on different on-axis oriented silicon substrates", Journal of Applied Physics, volume 105, page 084910 (2009) describes growing epitaxial films on 2-inch silicon wafers in a hot-wall, low-pressure chemical vapour (LPCVD) reactor using trichlorosilane ($SiHCl_3$) as a silicon supply, ethylene ($C_2H_4$) as a carbon supply and hydrogen ($H_2$) as a carrier gas at a growth temperature of 1350° C. A hot-wall CVD reactor tends to have a low throughput and requires regular, costly maintenance.

Wei-Yu Chen et al.:"Crystal Quality of 3C-SiC Influenced by the Diffusion Step in the Modified Four-Step Method", Journal of The Electrochemical Society, volume 157, pages H377-H380 (2010) describes growing epitaxial films on 1 cm×cm substrate in a horizontal, cold-wall-type LPCVD system using silane ($SiH_4$) as a silicon supply, propane ($C_3H_8$) as a carbon supply and hydrogen ($H_2$) as a carrier gas at a growth temperature of 1420° C. Although a cold-wall reactor is used, a complex 3- or 4-step deposition process is used, employing temperatures which are close to melting point of silicon. However, it is unclear if the process is repeatable, can be achieved without damaging the chamber and components inside the chamber, and can be used to produce high volumes of large-diameter wafers.

Y. Gao et al: "Low-temperature chemical-vapor deposition of 3C-SiC films on Si(100) using $SiH_4$—$C_2H_4$—HCl—$H_2$", Journal of Crystal Growth, volume 191, pages 439 to 445 (1998) describes deposition of 3C-SiC films on silicon using HCl to suppress pure silicon nucleation. The paper, however, omits several details, such as wafer offcut and size, and does not mention whether the substrate suffers from warp or bow after deposition. Furthermore, the SiC films appear to be very rough. From micrographs shown in the paper, RMS surface roughness values of SiC films appear to be several hundreds of nanometres. Moreover, although using a higher concentration of HCl appears to improve crystal quality, it reduces growth rate and if HCl is omitted, then the SiC films are polycrystalline.

SUMMARY

The present invention seeks to provide an improved method of and system for growing epitaxial 3C-SiC on single-crystal silicon, such as single-crystal silicon wafer or a single-crystal layer of silicon of a silicon-on-insulator wafer or the like.

According to a first aspect of the present invention there is provided a method of growing epitaxial 3C-SiC on single-crystal silicon. The method comprises providing a single-crystal substrate (such as single-crystal silicon wafer or a silicon-on-insulator wafer) in a cold-wall chemical vapour deposition reactor. The method comprises heating the substrate to a temperature equal to or greater than 700° C. and equal to or less than 1200° C. and introducing a gas mixture into the reactor, while the substrate is at the temperature, so as to deposit an epitaxial layer of 3C-SiC on the single-crystal silicon. The gas mixture comprises a silicon source precursor, a carbon source precursor and a carrier gas.

Thus, 3-SiC epilayers can be produced more cheaply not only because silicon can be used, which is, in itself cheaper, but also because much larger wafers (e.g. having a diameter of at least 100 mm) can be used, which can make 3C-SiC epilayer production even cheaper. Moreover, a commercially-available, cold wall, reduced- or atmospheric-pressure chemical vapour deposition reactor of a type normally used in silicon processing (but which is suitably modified) having a quartz chamber and infra-red lamp heat sources can be used to grow epitaxial 3C-SiC on single-crystal silicon.

The 3-SiC growth rate may be at least 1 µm/h. The growth rate may be at least 10 µm/h. The growth rate may be up to 20 µm/h or more. However, lower growth rates can be used, for example, to grow thin layers (e.g. <100 nm) of 3C-SiC.

The method may comprise growing 3C-SiC on a wafer. The wafer may have a diameter which is at least 100 mm, at least 200 mm or at least 450 mm or more. The wafer is preferably a single-crystal wafer. However, the wafer may be silicon-on-insulator (SOI) wafer or a silicon-on-sapphire (SoS) wafer or other, similar type of substrates.

The carbon source precursor may be an organosilicon compound. The carbon source precursor may be a methyl-containing silane. Preferably, the carbon source precursor is trimethylsilane ($C_3H_{10}Si$).

The silicon source precursor and carbon source precursor are preferably different, i.e. a single precursor serving as both silicon and carbon sources is not used.

The carbon source precursor may have a flow rate of at least 1 sccm or at least 10 sccm.

The silicon source precursor may be a silane, or a chlorine-containing silane. Preferably, the silicon source precursor is dichlorosilane ($SiH_2Cl_2$). The silicon source precursor may be trichlorosilane. The silicon source precursor may comprise first and second precursor components. For example, the silicon source precursor may comprise a mixture of gases, such as silane or disilane and hydrogen chloride (HCl).

The silicon source precursor may have a flow rate of at least 1 sccm or at least 10 sccm.

The carrier gas is preferably hydrogen ($H_2$).

The carrier gas may have a flow rate of at least 1 sccm or at least 10 sccm.

The ratio of the flow rate of the carbon source precursor and the silicon source precursor may be less than 3 and greater than 0.33. The ratio of the flow rate of the carbon source precursor and the silicon source precursor may be less than 2 and greater than 0.5. The flow rates of the carbon source precursor and the silicon source precursor may be the same or substantially the same (e.g. ratio of the flow rate of the carbon source precursor and the silicon source precursor is less than 1.2 and greater than 0.8).

The gas mixture preferably consists of a silicon source precursor, a carbon source precursor and a carrier gas or a silicon source precursor, a carbon source precursor, a carrier gas and a dopant source precursor.

The gas mixture preferably excludes (i.e. does not include or consist of) hydrogen chloride (HCl) gas.

The temperature may be equal to or greater than 900° C., equal to or greater than 900° C., or equal to or greater than 1000° C. The temperature is preferably equal to or greater than 1100° C.

Pressure in the reactor during deposition may be equal to or greater than 66.7 Pa (0.5 Torr) and equal to or less than 26.7 kPa (200 Torr) or equal to or less than 80 kPa (600 Torr), i.e. sub-atmospheric chemical vapour deposition. Pressure in the reactor during deposition is equal to or greater than 13.3 kPa (100 Torr) and equal to or less than 13.3 kPa (760 Torr).

The single-crystal silicon has an (001) surface orientation. The single-crystal silicon may have a (110) orientation. The single-crystal silicon may have a (111) orientation. An epilayer of 3C-SiC having (111) orientation (i.e. grown on (111)Si) can used as a substrate for gallium nitride (GaN) overgrowth.

Preferably, the surface of the single-crystal silicon is flat, i.e. unpatterned. The single-crystal silicon may be on-axis. The single-crystal silicon may be off-axis.

Using a low temperature for epitaxy can help to promote selective epitaxy. For example, if the silicon surface is covered with regions of dielectric material, such as silicon oxide or silicon nitride, or other masking material to form a mask, then 3C-SiC can be grown selectively on the silicon without growing on the mask.

According to a second aspect of the present intention there is provided a heterostructure comprising a region of single-crystal silicon having an upper surface (such as a single-crystal substrate) and a layer of epitaxial 3C-SiC disposed on the upper surface. The layer of epitaxial 3S-SiC may have a thickness of at least 1 nm or 10 nm or of at least 500 nm.

For a heterostructure having a diameter of at least 100 mm, there is substantially no wafer bow. The surface of the epitaxial 3C-SiC may have an RMS surface roughness, measured by AFM, equal to or less than 20 nm and preferably equal to or less than 10 nm.

According to a third aspect of the present intention there is provided a semiconductor device (such as an MOSFET or IGBT) comprising a heterostructure of the second aspect.

According to a fourth aspect of the present intention there is provided a MEMS device comprising a heterostructure of the second aspect.

According to a fifth aspect of the present intention there is provided a chemical vapour deposition system for growing epitaxial 3C-SiC on single-crystal silicon. The system comprises a cold-wall reactor housing, a support for the substrate, a supply of silicon source precursor, a supply of carbon source precursor, a supply of carrier gas, a set of mass flow controllers, each mass flow controller in selectable fluid communication to a respective supply, a manifold for receiving gas from the mass flow controllers and feeding a gas mixture to the reactor, a heater for heating the substrate, a temperature sensor for measuring the temperature of the substrate, a pressure sensor for measuring the pressure in the reactor, a vacuum pump in selectable fluid communication with the reactor, a control system configured, when the substrate is provided in the reactor, to cause deposition of a layer of 3C-SiC epitaxially on the monocrystalline silicon surface of the substrate at a temperature equal to or greater than 700° C. and equal to or less than 1,200° C.

The chemical vapour deposition system is preferably capable of a handling a substrate in the form of a wafer having a diameter of at least 100 mm. The system may be able to handle a wafer having a diameter equal to or greater than 200 mm or equal to or greater than 450 mm.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

3-SiC/Si Heterostructure 1

Figure 1:
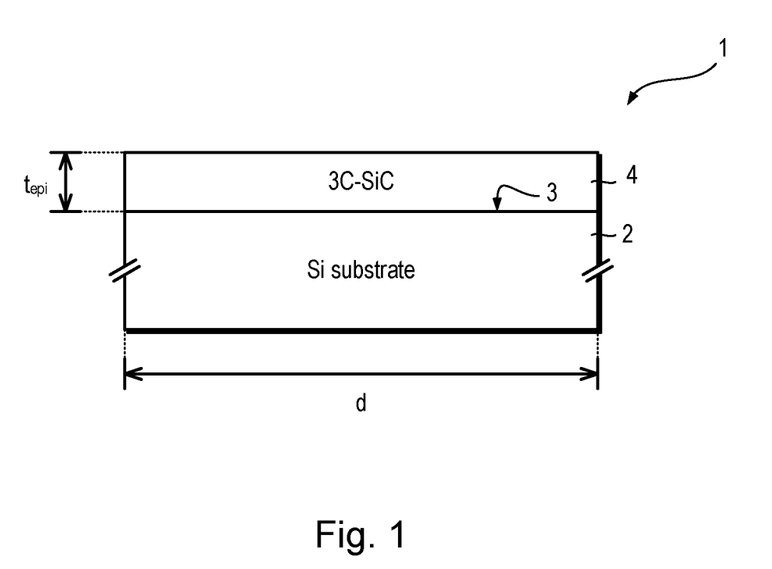
FIG. 1 illustrates a layer of 3C-SiC on an on-axis, 001-orientated single crystal substrate.

Referring to FIG. 1, a 3C-silicon carbide/silicon (3C-SiC/Si) heterostructure 1 which is produced by an epitaxial growth process in accordance with the present invention is shown.

The 3-SiC/Si heterostructure 1 comprises a single-crystal silicon substrate 2 having an upper surface 3 and a single-crystal layer 4 (herein also referred to as an "epitaxial layer" or "epilayer", or simply "layer") of 3C-SiC disposed directly on the upper surface 3 of the silicon substrate 2. However, a single-crystal silicon substrate 2 need not be used. A substrate (not shown) having a region or layer of single-crystal silicon at its upper surface can be used, such as silicon-on-insulator.

The silicon substrate 2 takes the form of on-axis (001)-orientation silicon wafer having a diameter, d, which is 100 nm. However, the diameter, d, can be as large as 450 mm or greater. The surface 3 of the silicon substrate 2 is not patterned. In other words, the surface 3 need not be specially configured to promote epitaxy.

The 3-SiC layer 4 has a thickness, $t_{epi}$, which can be more than or equal to 1 nm, more than or equal to 10 nm, more than or equal to 100 nm or more than or equal to 500 nm. The 3-SiC layer 4 may have a thickness, $t_{epi}$, having an order of magnitude of 1 µm, 10 or even 100 µm.

Chemical Vapour Deposition System 6

Figure 2:
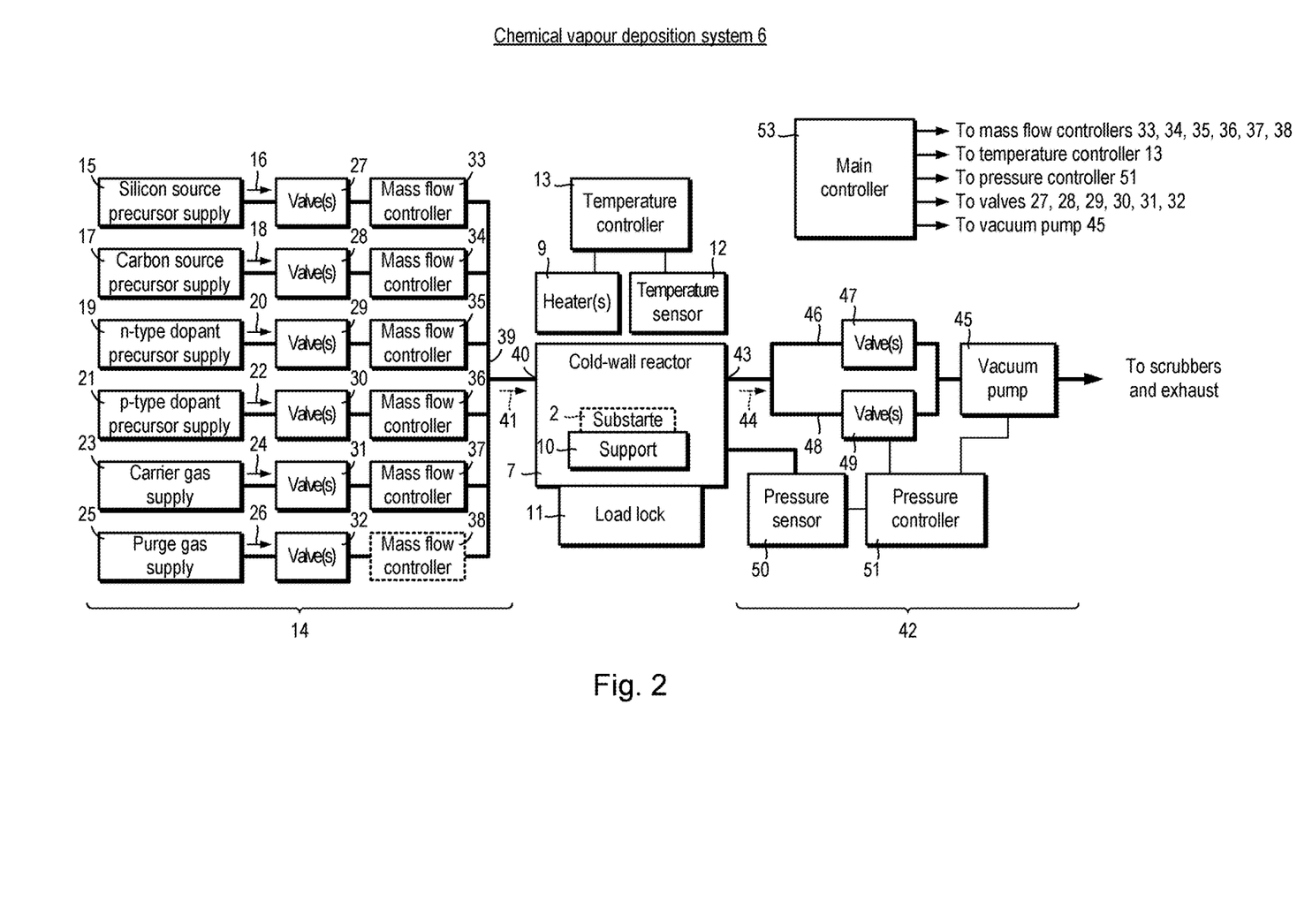
FIG. 2 is a schematic diagram of apparatus for growing epitaxial 3C-SiC on a substrate having a monocrystalline silicon surface.

Referring to FIG. 2, a chemical vapour deposition system 6 for epitaxially growing crystalline 3C-SiC layer on silicon in accordance with present invention is shown. The CVD system 6 takes the form of a reduced-pressure chemical vapour deposition (RP-CVD) system. In particular, the system 6 takes the form of an ASM Epsilon 2000 RP-CVD system. Various valves, such as vent valves, and lines, such as by-pass lines, are omitted from FIG. 2 for clarity.

The chemical vapour deposition system 6 comprises a cold-wall, horizontal-type reactor 7 having water-cooled quartz reactor walls (not shown) and a set of external heaters 9 which take the form infra-red lamps. Other forms of heaters 9, such as induction coils, can be used.

The reactor 7 houses a substrate support 10 for one or more silicon wafers 2 which may be loaded into the reactor via a load lock 11. Temperature, T, of the wafer(s) 2 is measured using a temperature sensor 12 in the form of a pyrometer. The heater 9 and, thus, the temperature, T, are controlled using a temperature controller 13.

The chemical vapour deposition system 6 includes a gas supply system 14 comprising a supply 15 of silicon source precursor 16, a supply 17 of carbon source precursor 18, an optional supply 19 of n-type dopant precursor 20, an optional supply 21 of n-type dopant precursor 22, a supply 23 of carrier gas 24 in the form of hydrogen gas ($H_2$) and a supply 25 of purge gas 26 in the form of nitrogen gas ($N_2$), a set of respective valves 27, 28, 29, 30, 31, 32 and a set of respective mass flow controllers 33, 34, 35, 36, 37, 38 which are used to supply gases at respective specified flow rates (measured in standard litres per minute or standard cubic centimetres per minute) into a manifold 39 which is coupled to a gas inlet 40 of the reactor 7.

As will be explained in more detail hereinafter, the gas supply system 14 is used to supply a gas mixture 41 comprising silicon source precursor 16, carbon source precursor 18, optionally a dopant precursor 20, 22 and carrier gas 24 to the reactor 7 for 3C-SiC epitaxy.

The chemical vapour deposition system 6 includes a pumping system 42 in fluid communication with an outlet 43 which can be used to extract reaction product mixture 44. The pumping system 42 comprises one or vacuum pumps 45 coupled to the outlet 43 via parallel arrangement of a high-conductance line 46 and corresponding valve 47 which can be used for rapidly pumping down the reactor 7 to base pressure and a low-conductance line 48 and corresponding flow-controllable valve 49 which can be used during growth. Pressure, P, in the reactor 7 is measured using a pressure sensor 50, for example, in the form of a Pirani gauge. The pump(s) 45, controllable valve 49 and, thus, the pressure, P, are controlled using a pressure controller 51.

The chemical vapour deposition system 6 includes a main controller 53, which can take the form of a computer system, which can be used to control the temperature controller 13, mass flow controllers 33, 34, 35, 36, 37, 38, and pressure controller 51, for example, by adjusting set points.

The silicon source precursor 16 takes the form of dichlorosilane (which may be referred to as "DCS") having a chemical formula $SiH_2Cl_2$ and the silicon source precursor 18 takes the form of trimethylsilane (which may be referred to as "TMS") having a chemical formula $C_3H_{10}Si$. The n-type dopant precursor 20 may take the form of arsine ($AsH_3$) or phosphine ($PH_3$). The p-type dopant precursor 22 may take the form diborane ($B_2H_6$).

Low-temperature (≤1,200° C.) epitaxial growth of crystalline 3C-SiC on Si

Using dichlorosilane 16 and trimethylsilane 18, the chemical vapour deposition system 6 can be used to grow crystalline 3C-SiC epilayers on blank (i.e. unpatterned) silicon substrates 2, such as on-axis (001)-orientated silicon wafers, at a deposition temperature, $T_{EPI}$, at or below 1,200° C. and growth rates above 10 µm/h can be achieved. If required, lower growth rates can be used.

Figure 3:
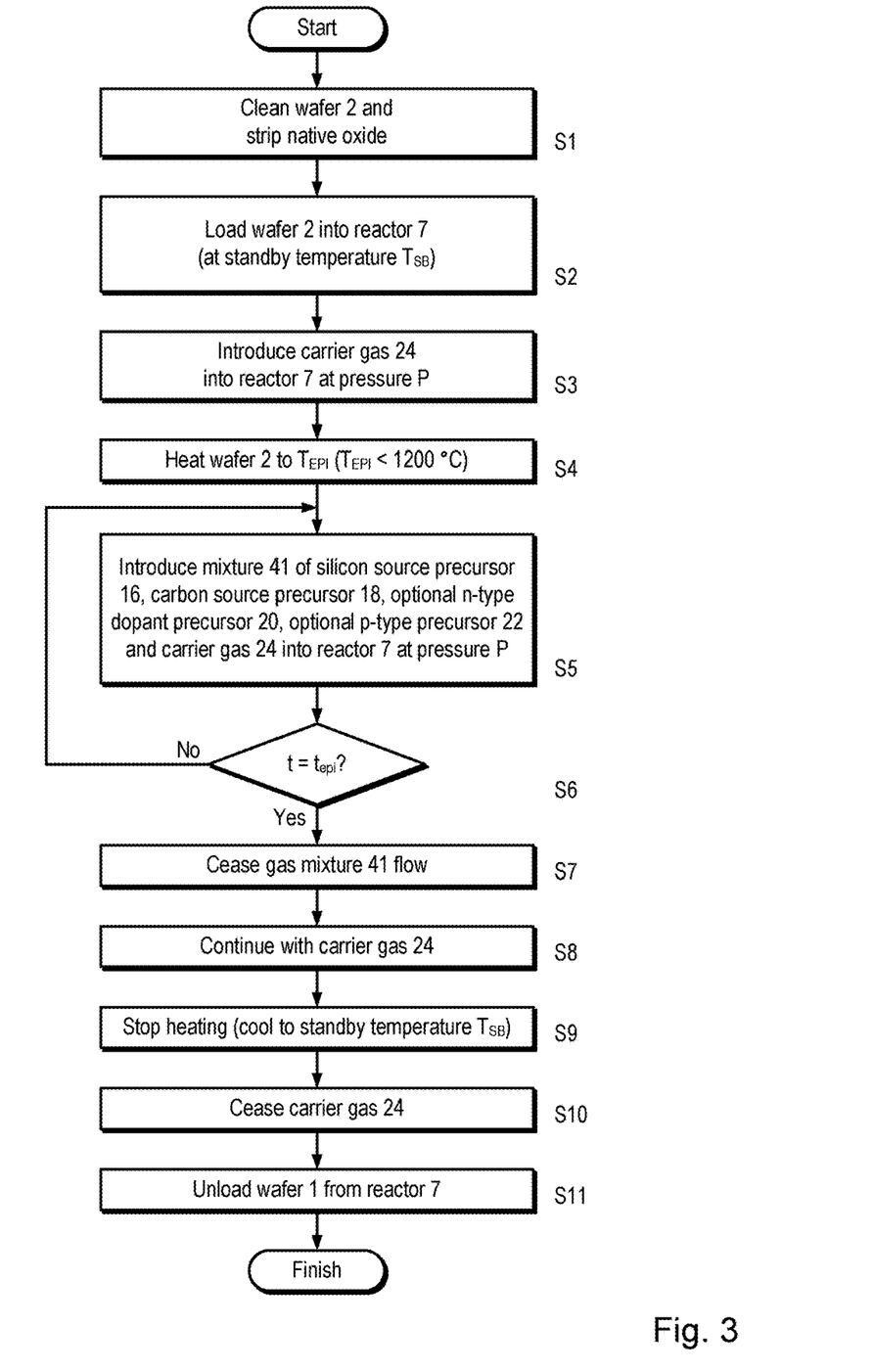
FIG. 3 is a process flow diagram of a method of growing epitaxial 3C-SiC on single-crystal silicon.

FIG. 3 is a process flow diagram of a method of growing epitaxial 3C-SiC on an on-axis (001)-orientated silicon wafer 2 is shown.

Figure 4:
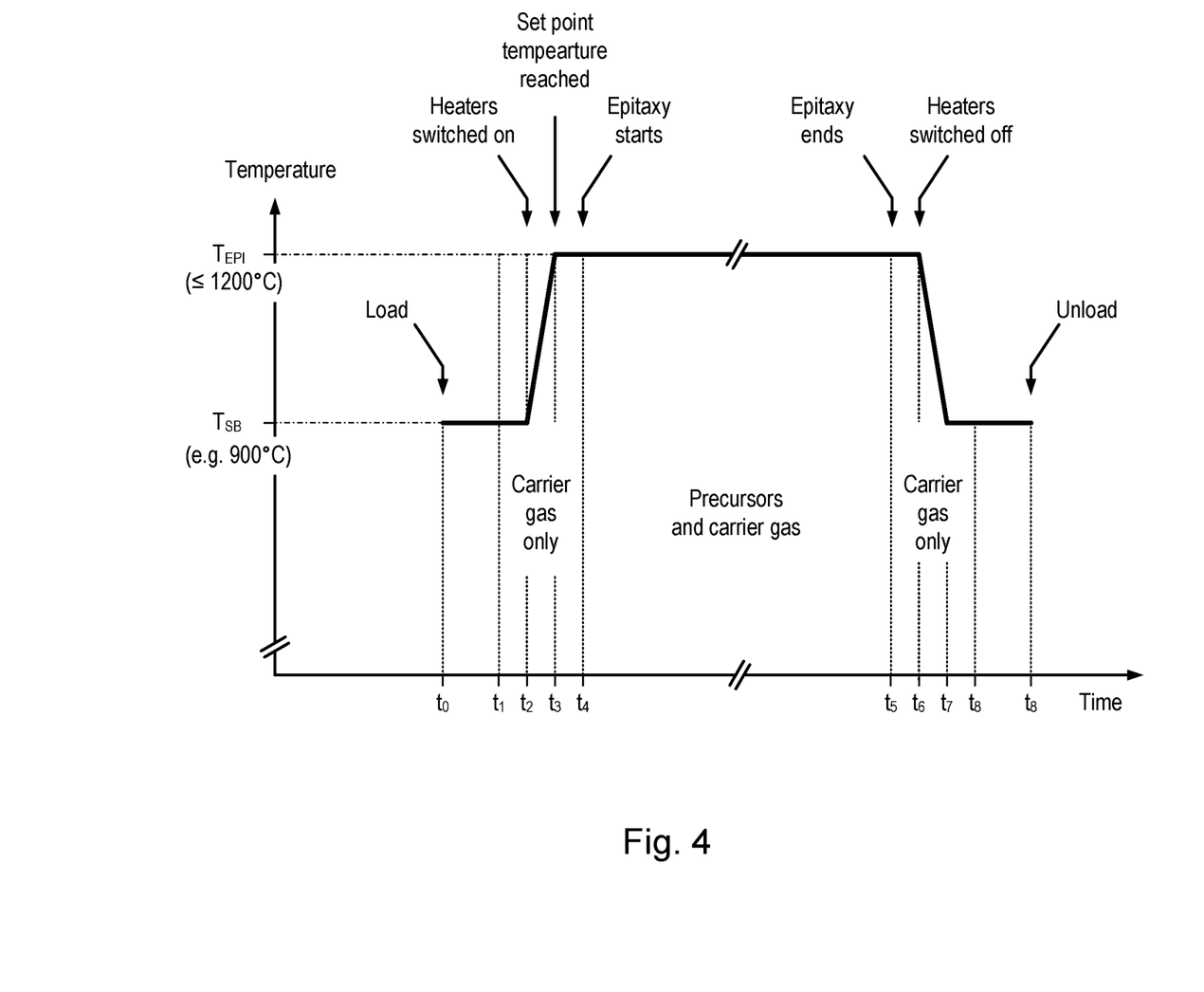
FIG. 4 illustrates a temperature profile of a 3C-SiC epitaxial growth process.

Referring to FIGS. 2, 3 and 4, an on-axis (001)-orientated silicon wafer 2 is cleaned and its native surface oxide (not shown) is removed using a hydrofluoric (HF) acid dip (step S1). The wafer 2 is loaded into the reactor 7 at a standby temperature, $T_{SB}$, via the load lock 11 at atmospheric pressure (step S2). The standby temperature, $T_{SB}$, is 900° C. However, the standby temperature, $T_{SB}$, can take a value between room temperature and 1,200° C.

Carrier gas 24, in this case hydrogen, is introduced into the reactor 7 at a flow rate of 10 slm at a pressure 100 Torr (step S3). The heaters 9 are switched on and are controlled so that the temperature of the wafer 2 reaches and is maintained at a set-point temperature, which in this case is 1,190° C. (step S4).

A mixture 41 of dichlorosilane 16, trimethylsilane 18 and hydrogen 24 is introduced into the reactor 7 have flow rates of 10 sccm, 10 sccm and 10,000 sccm respectively, while temperature is maintained at 1,190° C. and pressure is maintained at 13.3 kPa (100 Torr) (step S5). Thus, the partial pressures of the dichlorosilane 16 and trimethylsilane 18 are 13.3 Pa, 13.3 Pa respectively. The growth rate for this gas mixture 41 and gas flow rates, and at this temperature and pressure is about 20 µm/h.

The gas mixture 41 continues to flow until the desired thickness of 3C-SiC is grown (step S6). Once the desired thickness has been reached, the flow of dichlorosilane 16 and trimethylsilane 18 is stopped (step S7) but the carrier gas 24 continues to flow (step S8). The heaters 9 are switched off (step S19) and the 3-SiC/Si wafer 1 (FIG. 1) is allowed to cool. This can take about 5 to 10 minutes. Once the wafer 1 (FIG. 1) has cooled, carrier gas 20 flow is stopped and the reactor 7 purged (step S10). The 3-SiC/Si wafer 1 (FIG. 1) is then removed from the reactor 7 (step S11).

The 3-SiC/Si wafer 1 can be processed to form power electronic devices, such as SiC MOSFETs and/or SiC IGBTs (not shown), using the 3C-SiC to form the drift layer, doped well regions and source and drain regions.

The 3-SiC/Si wafer 1 can be processed to form MEMS devices.

Figure 5:
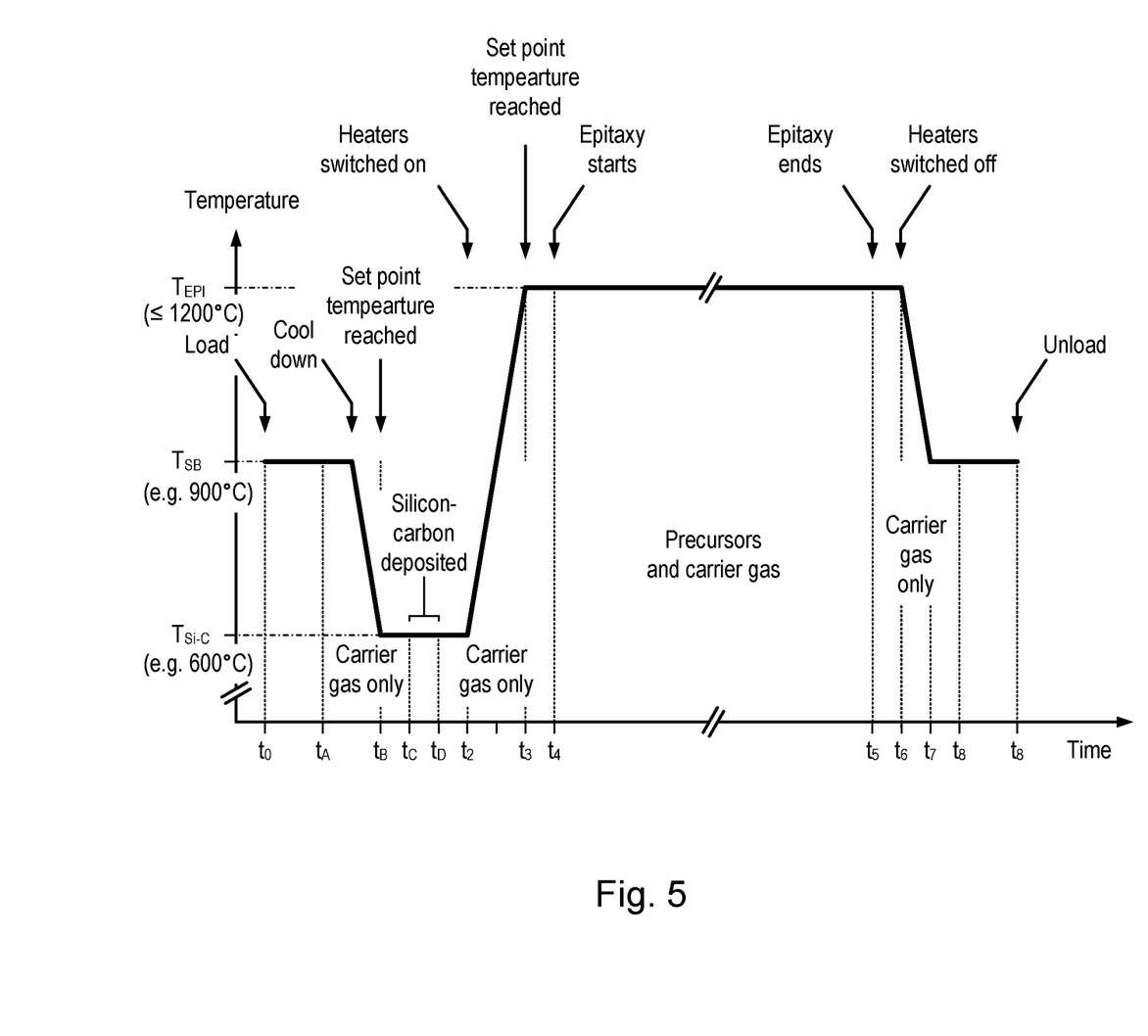
FIG. 5 illustrates a temperature profile of a modified 3C-SiC epitaxial growth process.

Referring to FIG. 5, the process can be modified by forming in-situ a thin seed layer (not shown) prior to epitaxy. The seed layer (not shown) comprises a layer of silicon-carbon ($Si_{1-x}C_x$, where x is about 0.01) having a thickness of up to 10 nm.

After loading the wafer 2 into the reactor 7 at a standby temperature, $T_{SB}$, via the load lock 11 at atmospheric pressure, the wafer 2 is cooled to about 600° C. A short deposition cycle (e.g. lasting a few minutes) using the same precursors, same flow rates and same pressure is carried out. Due to the lower temperature, however, the process does not result in epitaxy.

Without wishing to be bound by theory, the seed layer (not shown) is thought to help prevent the formation of voids at the surface of the silicon during epitaxy.

Characterisation

No wafer bow can be observed in a 3C-SiC/Si heterostructure 1 comprising a 3C-SiC epilayer grown on a 100 mm-diameter (100) orientation, on-axis single-crystal silicon wafer at 1,190° C. using dichlorosilane and trimethylsilane using the process hereinbefore described. Furthermore, the 3C-SiC/Si heterostructure 1 has an RMS surface roughness of (10±1) nm as measured using an atomic force microscope.

Figure 6:
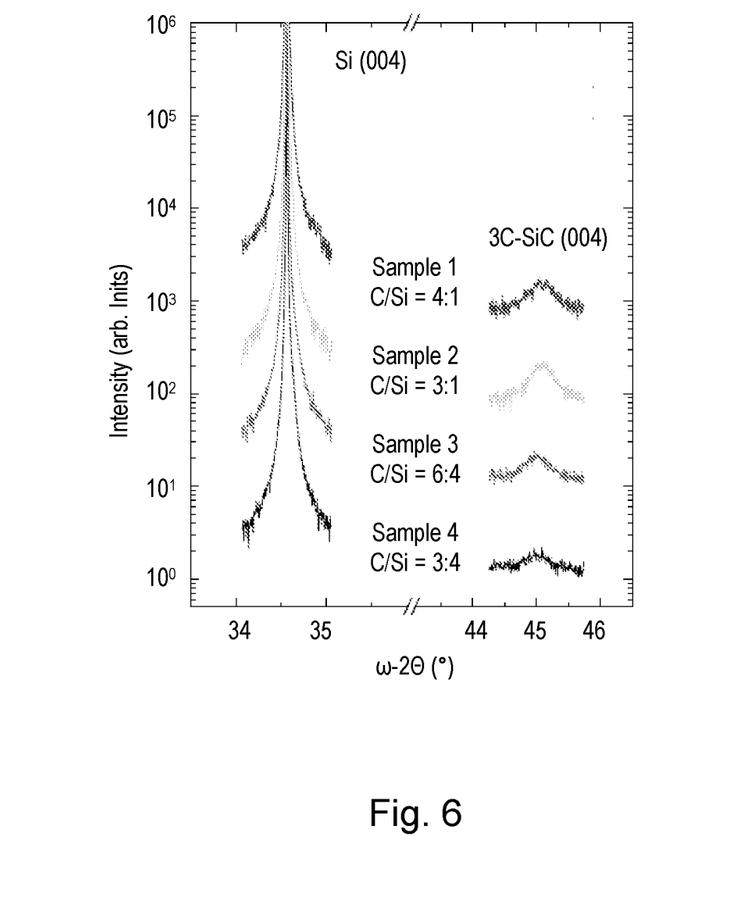
FIG. 6 illustrates symmetrical x-ray diffraction ω-2θ plots for four 3C-SiC/Si heterostructures having different carbon-to-silicon ratios.

FIG. 6 illustrates symmetrical x-ray diffraction ω-2θ plots for first, second, third and fourth 3C-SiC/Si heterostructures having carbon-to-silicon ratios of 4:1, 3:1, 6:4 and 3:4 respectively.

Peaks from the Si(001) substrate and the 3C-SiC epilayers are clearly visible at 34.5° and 45° respectively. The plots show that that the 3C-SiC epilayers are crystalline.

Figure 7:
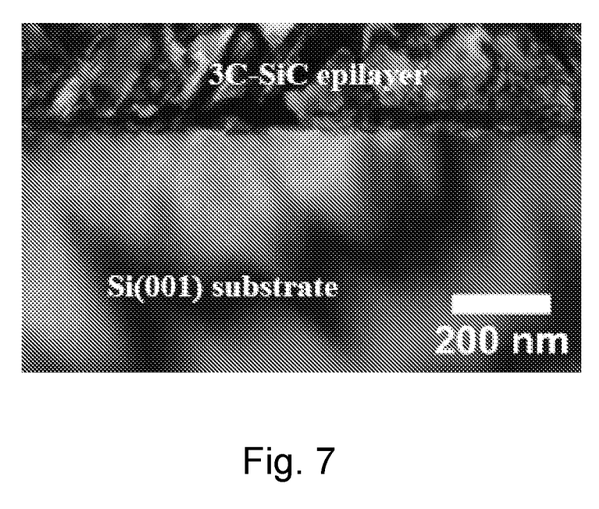
FIG. 7 is dark-field transmission electron microscope (TEM) micrograph of a cross section, in the 220 plane, a layer of crystalline 3C-SiC on Si(001) showing the presence of stacking faults and lack of voids at the 3C-SiC/Si interface.

FIG. 7 shows a cross-sectional TEM image of a 3C-SiC/Si(001) heterostructure 1 grown using the process hereinbefore described at a temperature of 1,190° C. The TEM image verifies the crystallinity and quality of the low-temperature grown 3C-SiC epilayer.

By using different precursors as the silicon and carbon sources, it is possible to adjust the carbon-to-silicon ratio and inhibit out-diffusion of silicon from the substrate and prevent the formation of voids.

Modifications

It will be appreciated that many modifications may be made to the embodiments hereinbefore described.

The silicon substrate can take the form of silicon-on-insulator (SOI) substrate comprising a silicon handle layer, a buried oxide layer and a top silicon layer. The silicon substrate need not have (001) crystal orientation, but can have other crystal orientations, such as (111) or (110).

The CVD system need not be an RPCVD system, but can be an atmospheric pressure chemical vapour deposition (APCVD) system. The reactor need not be a horizontal-type reactor, but can take other forms, such as a radiant barrel-type or vertical-type reactor.

A cold wall, reduced- or atmospheric-pressure chemical vapour deposition reactor of a type normally used in industrial-scale silicon processing (which can handle wafers having a diameter of at least 100 mm) and which is provided with suitable precursors can be used to grow epitaxial 3C-SiC on single-crystal silicon.

Other silicon source precursors may be used. For example, silanes may be used, such as silane ($SiH_4$) or chlorine-containing silanes, such as trichlorosilane ($SiHCl_3$).

Other carbon source precursors may be used. For example, methyl-containing silanes may be used, such as methylsilane ($CH_6Si$) or penta-methylene methyl silane ($C_6H_{14}Si$).

Other carrier gases can be used, such as argon or helium.

The invention claimed is:

1. A method of growing epitaxial 3C-SiC on single-crystal silicon, the method comprising:
providing a single-crystal silicon substrate having a diameter of at least 100 mm in a cold-wall chemical vapor deposition reactor comprising a quartz chamber;
heating the substrate to a temperature equal to or greater than 700° C. and equal to or less than 1200° C. using external heaters comprising infra-red lamps;
introducing a gas mixture into the reactor while the substrate is at the temperature, the gas mixture comprising a silicon source precursor, a carbon source precursor which is different from the silicon source precursor and a carrier gas so as to deposit an epitaxial layer of 3C-SiC on the single-crystal silicon wherein the silicon source precursor (16) comprises a silane or a chlorine-containing silane and the carbon source precursor (18) is a methyl-containing silane, and the epitaxial layer of $_3$C-SiC is grown continuously.

2. A method according to claim 1, wherein the carbon source precursor comprises trimethylsilane.

3. A method according to claim 1, wherein flow rate of the carbon source precursor is at least 1 sccm.

4. A method according to claim 1, wherein flow rate of the carbon source precursor is at least 10 sccm.

5. A method according to claim 1, wherein the silicon source precursor comprises a dichlorosilane.

6. A method according to claim 1, wherein the silicon source precursor comprises two or more different precursor components.

7. A method according to claim 1, wherein flow rate of the silicon source precursor is at least 1 sccm.

8. A method according to claim 1, wherein flow rate of the silicon source precursor is at least 10 sccm.

9. A method according to claim 1, wherein the ratio of the flow rate of the carbon source precursor and the silicon source precursor is less than 1.2 and greater than 0.8.

10. A method according to claim 1, wherein the flow rates of the carbon source precursor and the silicon source precursor is the same.

11. A method according to claim 1, wherein the temperature, T, is equal to or greater than 1100° C.

12. A method according to claim 1, wherein pressure in the reactor during deposition is equal to or greater than 66.7 Pa (0.5 Torr) and equal to or less than 26.7 kPa (200 Torr).

13. A method according to claim 1, wherein pressure in the reactor during deposition is equal to or greater than 13.3 kPa (100 Torr).

14. A method according to claim 1, wherein the single-crystal silicon has an (001) surface orientation.

15. A method according to claim 1, wherein the single-crystal silicon substrate has a flat surface.

16. A method according to claim 1, wherein the single-crystal silicon substrate comprises a single-crystal silicon wafer.

17. A method according to claim 1, wherein the gas mixture excludes hydrogen chloride (HCl) gas.

* * * * *